(12) United States Patent
Moore et al.

(10) Patent No.: US 11,776,793 B2
(45) Date of Patent: *Oct. 3, 2023

(54) PLASMA SOURCE WITH CERAMIC ELECTRODE PLATE

(71) Applicant: Applied Materials, Inc., Santa Clara, CA (US)

(72) Inventors: Robert B. Moore, Bigfork, MT (US); Jared Ahmad Lee, San Jose, CA (US); Marc David Shull, Los Gatos, CA (US); Tsutomu Tanaka, Santa Clara, CA (US); Alexander V. Garachtchenko, Mountain View, CA (US); Dmitry A. Dzilno, Sunnyvale, CA (US)

(73) Assignee: Applied Materials, Inc., Santa Clara, CA (US)

( * ) Notice: Subject to any disclaimer, the term of this patent is extended or adjusted under 35 U.S.C. 154(b) by 280 days.

This patent is subject to a terminal disclaimer.

(21) Appl. No.: 17/097,492

(22) Filed: Nov. 13, 2020

(65) Prior Publication Data

US 2022/0157569 A1    May 19, 2022

(51) Int. Cl.
*H01J 37/32* (2006.01)

(52) U.S. Cl.
CPC .... *H01J 37/32541* (2013.01); *H01J 37/3244* (2013.01); *H01J 37/3255* (2013.01); *H01J 2237/0453* (2013.01)

(58) Field of Classification Search
CPC ............... H01J 37/3244; H01J 37/3255; H01J 37/32541; H01J 37/32568
See application file for complete search history.

(56) References Cited

U.S. PATENT DOCUMENTS

| | | |
|---|---|---|
| 5,186,718 A | 2/1993 | Tepman et al. |
| 5,210,466 A | 5/1993 | Collins et al. |
| 5,646,489 A | 7/1997 | Kakehi et al. |
| 5,685,941 A | 11/1997 | Forster et al. |
| 6,132,566 A | 10/2000 | Hofmann et al. |
| 6,149,784 A | 11/2000 | Su et al. |
| 6,176,981 B1 | 1/2001 | Hong et al. |
| 6,190,513 B1 | 2/2001 | Forster et al. |
| 6,203,620 B1 | 3/2001 | Moslehi |
| 6,228,229 B1 | 5/2001 | Raaijmakers et al. |
| 6,264,812 B1 | 7/2001 | Raaijmakers et al. |
| 6,297,595 B1 | 10/2001 | Stimson et al. |
| 6,461,483 B1 | 10/2002 | Gopalraja et al. |
| 6,486,431 B1 | 11/2002 | Smith et al. |
| 6,565,717 B1 | 5/2003 | Leet et al. |

(Continued)

FOREIGN PATENT DOCUMENTS

KR    102107985 B1    5/2020

OTHER PUBLICATIONS

PCT International Search Report and Written Opinion in PCT/US2021/058378 dated Mar. 2, 2022, 9 pages.

*Primary Examiner* — Tung X Le
(74) *Attorney, Agent, or Firm* — Servilla Whitney LLC

(57) ABSTRACT

A plasma source assembly for use with a substrate processing chamber is described. The assembly includes a ceramic lower plate with a plurality of apertures formed therein. A method of processing a substrate in a substrate processing chamber including the plasma source assembly is also described.

20 Claims, 5 Drawing Sheets

(56) References Cited

U.S. PATENT DOCUMENTS

| | | |
|---|---|---|
| 6,632,324 B2 | 10/2003 | Chan |
| 6,707,255 B2 | 3/2004 | Coumou et al. |
| 6,815,633 B1 | 11/2004 | Chen et al. |
| 7,102,292 B2 | 9/2006 | Parsons et al. |
| 7,396,431 B2 | 7/2008 | Chen et al. |
| 8,040,068 B2 | 10/2011 | Coumou et al. |
| 8,884,523 B2 | 11/2014 | Winterhalter et al. |
| 9,711,330 B2 | 7/2017 | Bera |
| 9,947,511 B2 * | 4/2018 | Ando ................ H01J 37/32522 |
| 2003/0137250 A1 | 7/2003 | Mitrovic |
| 2003/0216037 A1 | 11/2003 | Zhang et al. |
| 2004/0159287 A1 | 8/2004 | Hoffman et al. |
| 2004/0194890 A1 | 10/2004 | Moroz |
| 2005/0167263 A1 | 8/2005 | Chistyakov |
| 2006/0065367 A1 | 3/2006 | Chen et al. |
| 2007/0170156 A1 * | 7/2007 | Hayashi ............ H01J 37/32559 |
| | | 219/121.45 |
| 2007/0212896 A1 | 9/2007 | Olsen et al. |
| 2008/0044960 A1 | 2/2008 | Al-Bayati et al. |
| 2008/0099426 A1 | 5/2008 | Kumar et al. |
| 2009/0229755 A1 | 9/2009 | Ohmi et al. |
| 2010/0004110 A1 | 1/2010 | Barker et al. |
| 2011/0180213 A1 | 7/2011 | Hirayama et al. |
| 2012/0073757 A1 | 3/2012 | Yamazawa |
| 2013/0249382 A1 * | 9/2013 | Lee ......................... H01J 9/148 |
| | | 445/24 |
| 2014/0165911 A1 * | 6/2014 | Kao .................. H01J 37/32091 |
| | | 313/231.41 |
| 2015/0024582 A1 | 1/2015 | Taylor |
| 2016/0104606 A1 | 4/2016 | Park et al. |
| 2016/0155617 A1 * | 6/2016 | Kusumoto ........ H01L 21/67103 |
| | | 156/345.27 |
| 2016/0293388 A1 * | 10/2016 | Chen ................ H01J 37/32568 |
| 2019/0025663 A1 * | 1/2019 | Suzuki .................. G02F 1/1525 |
| 2022/0084796 A1 * | 3/2022 | Truong ............... H01L 21/0228 |

* cited by examiner

PLASMA SOURCE WITH CERAMIC ELECTRODE PLATE

BACKGROUND

Embodiments of the disclosure generally relate to apparatus and methods for processing substrates. More particularly, embodiments of the disclosure relate to plasma sources for use with substrate processing chambers.

Semiconductor device formation is commonly conducted in substrate processing systems or platforms containing multiple substrate processing chambers, and these systems or platforms may also be referred to as cluster tools. In some instances, the purpose of a multi-chamber processing platform or cluster tool is to perform two or more processes on a substrate sequentially in a controlled environment. In other instances, however, a multiple chamber processing platform may only perform a single processing step on substrates. The additional chambers can be employed to maximize the rate at which substrates are processed. In the latter case, the process performed on substrates is typically a batch process, wherein a relatively large number of substrates, e.g. 25 or 50, is processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

In some substrate processing chambers, capacitively coupled plasma is used to deposit thin films on substrates or to treat films that have been deposited on substrates by ALD or CVD. Such chambers may be referred to as plasma enhanced ALD (PEALD) chambers and plasma enhanced CVD (PECVD) chambers. A plasma is formed between two spaced apart electrodes in the form of an upper plate and a lower plate, which may be made from metal. There is a need to provide a lower plate that exhibits the proper electrical conductivity to form a plasma, but also minimizing issues that are encountered with metal contamination associated with metal lower plates. There is also a need to provide lower plates that have a high number of small, densely packed apertures which allow gases to pass therethrough during PEALD an PECVD processes.

SUMMARY

One or more embodiments of the disclosure are directed to a plasma source assembly comprising a first electrode comprising a conductive plate having a top surface, a bottom surface, and an outer peripheral edge; a second electrode comprising a conductive plate having a top surface, a bottom surface, and an outer peripheral edge; a dielectric spacer separating the first electrode and the second electrode and disposed at the outer peripheral edge of the first electrode and the outer peripheral edge of the second electrode, the second electrode comprising a ceramic material and a plurality of apertures therein; and a power feed electrically connected to the first electrode.

Additional embodiments of the disclosure are directed to a plasma source assembly comprising a first electrode comprising a conductive plate having a top surface, a bottom surface, and an outer peripheral edge; a second electrode comprising a conductive plate having a top surface, a bottom surface, and an outer peripheral edge; a dielectric spacer separating the first electrode and the second electrode and disposed at the outer peripheral edge of the first electrode and the outer peripheral edge of the second electrode, the second electrode comprising a reaction bonded silicon carbide and a plurality of apertures therein; and a power feed electrically connected to the first electrode.

Further embodiments of the disclosure are directed to a method of processing a substrate in a substrate processing chamber, the method comprising placing a substrate in the substrate processing chamber comprising a first electrode comprising a conductive plate having a top surface, a bottom surface, a an outer peripheral edge and a plurality of apertures allowing a gas to flow therethrough; a second electrode comprising a conductive plate made from a ceramic material having a top surface, a bottom surface, an outer peripheral edge and a plurality of apertures allowing a gas to flow therethrough; a dielectric spacer separating the first electrode and the second electrode and disposed at the outer peripheral edge of the first electrode and the outer peripheral edge of the second electrode; and a power feed electrically connected to the first electrode. The method further comprises forming a plasma between the first electrode and the second electrode.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Embodiments of the disclosure provide plasma source assembly and a substrate processing chamber including a plasma source assembly in accordance with one or more embodiments of the disclosure. Further embodiments of the disclosure provide methods of processing a substrate in a substrate processing chamber.

As used in this specification and the appended claims, the term "substrate" and "wafer" are used interchangeably, both referring to a surface, or portion of a surface, upon which a process acts. It will also be understood by those skilled in the art that reference to a substrate can also refer to only a portion of the substrate, unless the context clearly indicates otherwise. Additionally, reference to depositing on a substrate can mean both a bare substrate and a substrate with one or more films or features deposited or formed thereon.

As used in this specification and the appended claims, the terms "reactive gas", "precursor", "reactant", and the like, are used interchangeably to mean a gas that includes a species which is reactive with a substrate surface. For example, a first "reactive gas" may simply adsorb onto the surface of a substrate and be available for further chemical reaction with a second reactive gas.

Figure 1:
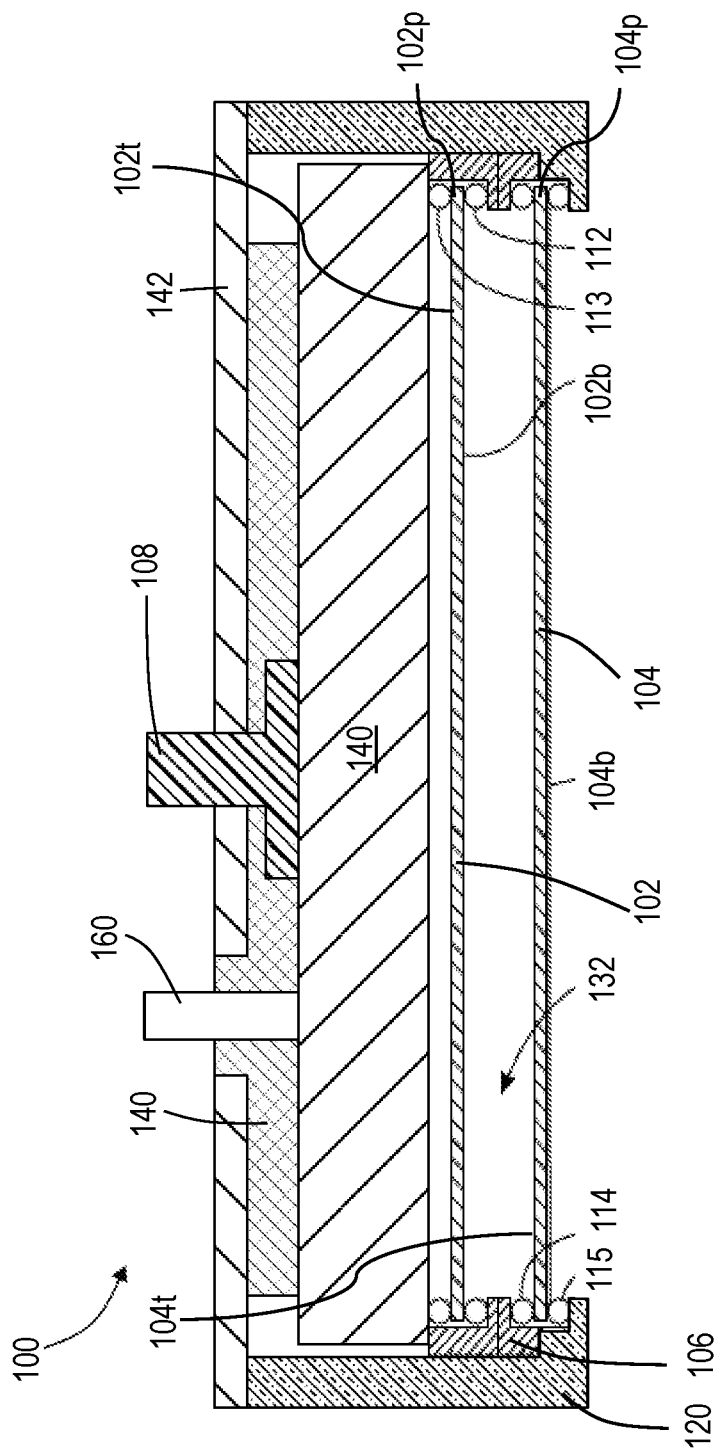
FIG. 1 shows a cross-sectional view of a plasma source assembly in accordance with one or more embodiments of the disclosure.

Referring now to FIG. 1, a plasma source assembly 100 according to one or more embodiments is shown. In the embodiment shown the plasma source assembly 100 comprises a first electrode 102 comprising a conductive plate having a top surface 102*t*, a bottom surface 102*b* and an outer peripheral edge 102*p*. The plasma source assembly 100 further comprises a second electrode 104 comprising a conductive plate having a top surface 104*t*, a bottom surface 104*b* and an outer peripheral edge 104*p*. In the embodiments shown and described in this disclosure, the first electrode 102 may be referred to an upper plate and the second electrode 104 may be referred to a lower plate, as the first electrode 102 is disposed above the second electrode 104 and separated by the gap 132.

Figure 2:
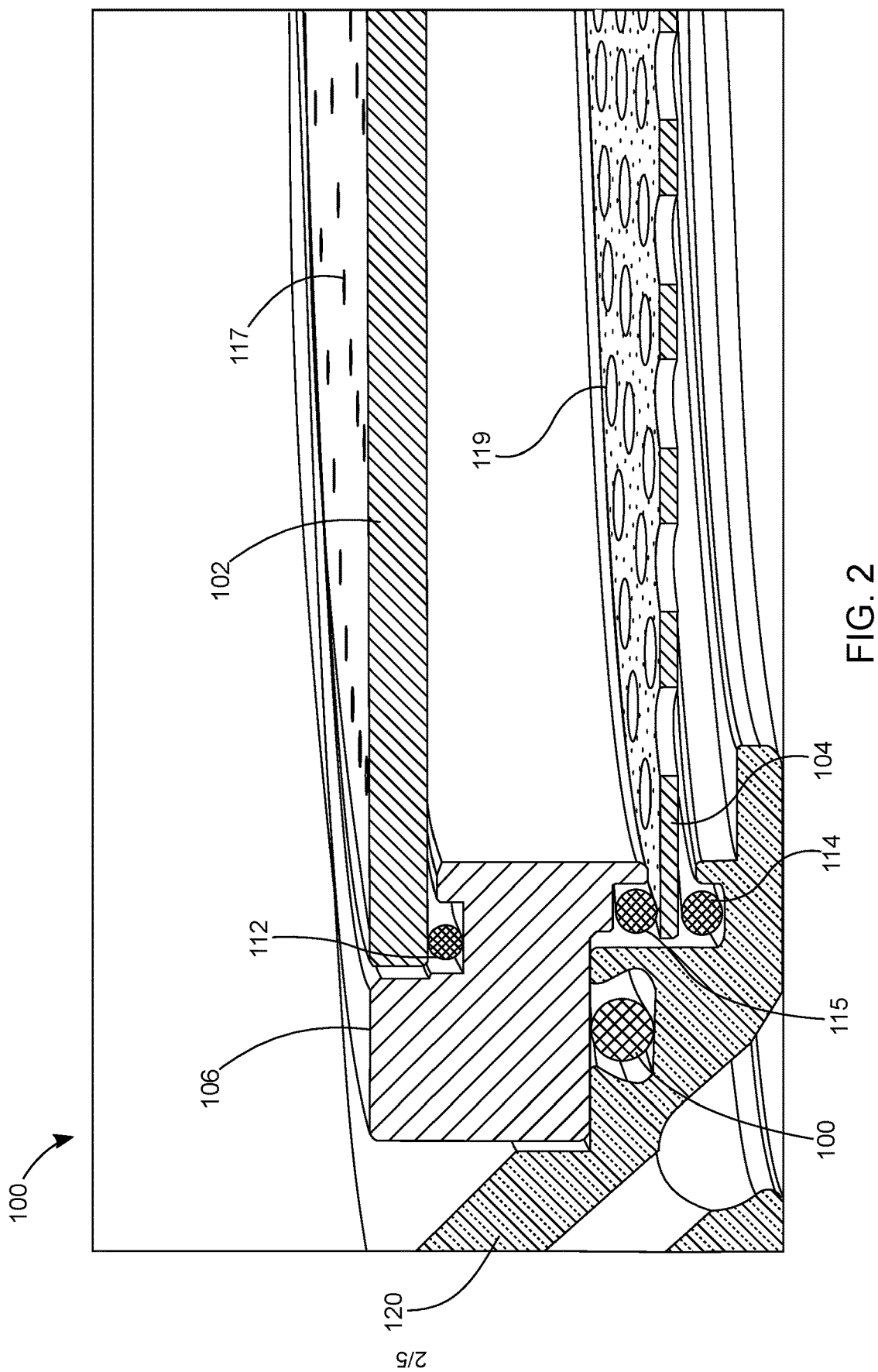
FIG. 2 shows an isometric view of a portion of a plasma source assembly in accordance with one or more embodiments of the disclosure
Figure 3:
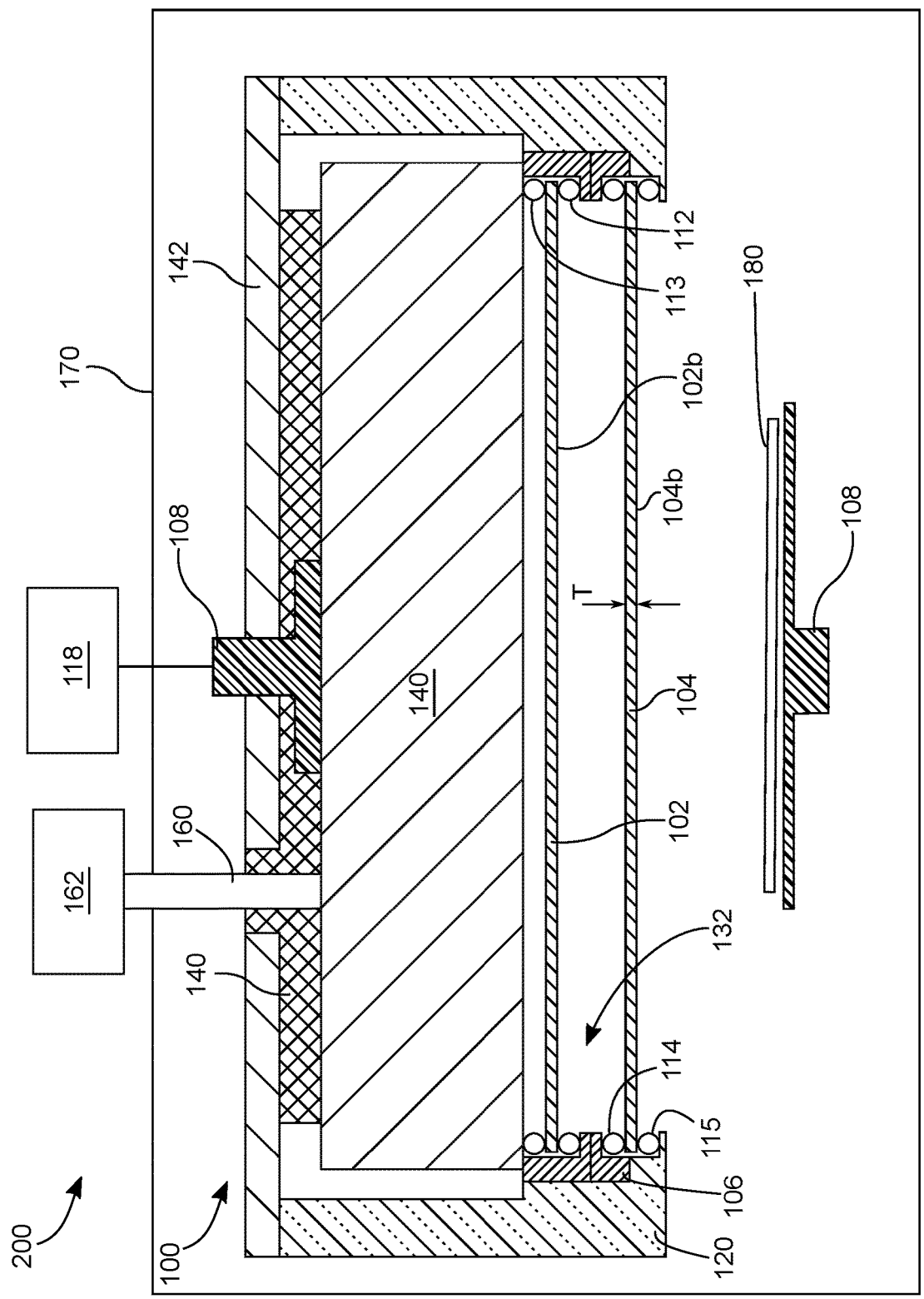
FIG. 3 shows a cross-sectional view of a substrate processing chamber including a plasma source assembly in accordance with one or more embodiments of the disclosure.

The plasma source assembly 100 further comprises a dielectric spacer 106 separating the first electrode 102 and the second electrode 104 and disposed at the outer peripheral edge 102*p* of the first electrode 102 and the outer peripheral edge 104*p* of the second electrode 104. There is a power feed 108 electrically connected to the first electrode 102 and the second electrode. In some embodiments, the plasma source assembly may further comprises a first o-ring 112 disposed between the bottom surface 102*b* of the first electrode and the dielectric spacer 106. In one or more embodiments, a second o-ring 114 may be disposed between the top surface 104*t* of the second electrode 104 and the dielectric spacer 106. According to one or more embodiments, the shape of the first electrode 102 and the second electrode 104 is generally round, and the first electrode 102 and the second electrode 104 each have a disc shape. However, the plasma source assembly is not limited to electrodes having a particular shape. In embodiments in which the electrodes are disc shaped, the dielectric spacer 106 in some embodiments is ring shaped and surrounds the first electrode 102 and the second electrode 104. In FIG. 1 the dielectric spacer 106 is shown as constructed of two separate pieces abutting each other, however, as shown in FIG. 2, the dielectric spacer 106 can be a single piece as shown in FIG. 3. In some embodiments, there may be a third o-ring 113 disposed on the top surface 102*t* of the first electrode 102 and adjacent to the outer peripheral edge 102*p*. In some embodiments, there may be a fourth o-ring 115 in contact with the bottom surface 104*b* of the second electrode 104 and adjacent to the peripheral edge.

According to one or more embodiments, the first o-ring 112 is located adjacent to the outer peripheral edge 102*p* of the first electrode 102, and the second o-ring 114 is located adjacent to the outer peripheral edge 104*p* of the second electrode 104.

According to one or more embodiments, each of the first o-ring 112 and the second o-ring 114 comprises a material that can withstand the temperatures of the processing chamber, for example, polytetrafluoroethylene (PTFE). In some embodiments, the third o-ring 113 and the fourth o-ring 115 comprise a material that can withstand the temperatures of the processing chamber, for example, polytetrafluoroethylene (PTFE).

The plasma source assembly 100 shown in FIG. 1 further comprises a purge ring 120 comprising a conductive material surrounding and in contact with the dielectric spacer 106, and a power feed 108 in electrical communication with the purge ring 120. In one or more embodiments, the purge ring 120 comprises a metal such as aluminum or stainless steel, and the dielectric spacer 106 comprises a ring made from a ceramic such as alumina or quartz.

In the embodiment of the plasma source assembly 100 shown, the first electrode 102 and the second electrode 104 are spaced apart to provide a gap 132 between the first electrode 102 and the second electrode 104. In one or more embodiments, the first electrode 102 and the second electrode 104 comprise a material that allows a plasma to be formed between the first electrode 102 and the second electrode 104. In some embodiments, the first electrode 102 and the second electrode 104 are made from or comprise silicon. The first electrode 102 may comprise a doped silicon. In specific embodiments, the second electrode 104 is made from a ceramic material as described further herein.

As shown in FIG. 2, the first electrode comprises a plurality of apertures 117 that allow a gas to pass through the first electrode 102 and into the gap 132. In some embodiments, the second electrode 104 comprises a plurality of apertures 119 that allow a gas to pass through towards a substrate 150 on a pedestal 152 in a substrate processing chamber 200.

In some embodiments, first o-ring 112 comprises a circular cross-section o-ring that is in contact with the bottom surface 102*b* of the first electrode adjacent to the outer peripheral edge 102*p* of the first electrode 102, and the second o-ring 114 comprises a circular cross-section o-ring that is in contact with the top surface 104*t* of the second electrode 104 adjacent to the outer peripheral edge 104*p* of the second electrode 104.

In a specific embodiment of the disclosure, a plasma source assembly comprises a first electrode 102 comprising a conductive plate having a top surface 102*t*, a bottom surface 102*b* and an outer peripheral edge 102*p* and a plurality of apertures 117 allowing a gas to flow therethrough. There is a second electrode 104 comprising a conductive plate having a top surface 104*t*, a bottom surface 104*b* and an outer peripheral edge 104*p* and a plurality of apertures 119 allowing a gas to flow therethrough. There is in the embodiments shown a dielectric spacer 106 separating the first electrode 102 and the second electrode 104 and disposed at the outer peripheral edge of the first electrode and the outer peripheral edge of the second electrode. There is a power feed 108 electrically connected to the first electrode 102 and a first o-ring 112 in the form of a circular cross-section o-ring disposed between the bottom surface 102*b* of the first electrode 102 and the dielectric spacer 106, the first o-ring 112 coaxial with the outer peripheral edge 102*p* of the first electrode. There is a second o-ring 114 in the form of a circular cross-section o-ring disposed between the top surface 114*t* of the second electrode 104 and the dielectric spacer 106, the second o-ring 114 comprising and coaxial with the outer peripheral edge 104*p* of the second electrode 104.

As shown in FIG. 3, the plasma source assembly 100 can be incorporated into a substrate processing chamber 200, for example, PEALD or PECVD chamber. The plasma source may include an isolator 140 comprising an insulator material such as a ceramic and a lid 142 comprising a metal. The plasma source assembly further comprises a gas inlet 160 in the form a conduit. The gas inlet 160 is connected to a gas supply to supply a processing gas, for example argon or another suitable gas for forming a plasma. The power feed 108 is connected to a suitable power supply such as a radio frequency (RF) or microwave power supply. The substrate processing chamber 200 may be in an enclosure 170. A substrate 180 may be placed upon a substrate support 172, which may be a susceptor or other suitable substrate support. The frequency of the plasma may be tuned depending on the specific reactive species being used. Suitable frequencies include, but are not limited to, 2 MHz, 13.56 MHz, 40 MHz, 60 MHz and 100 MHz.

Figure 4B:
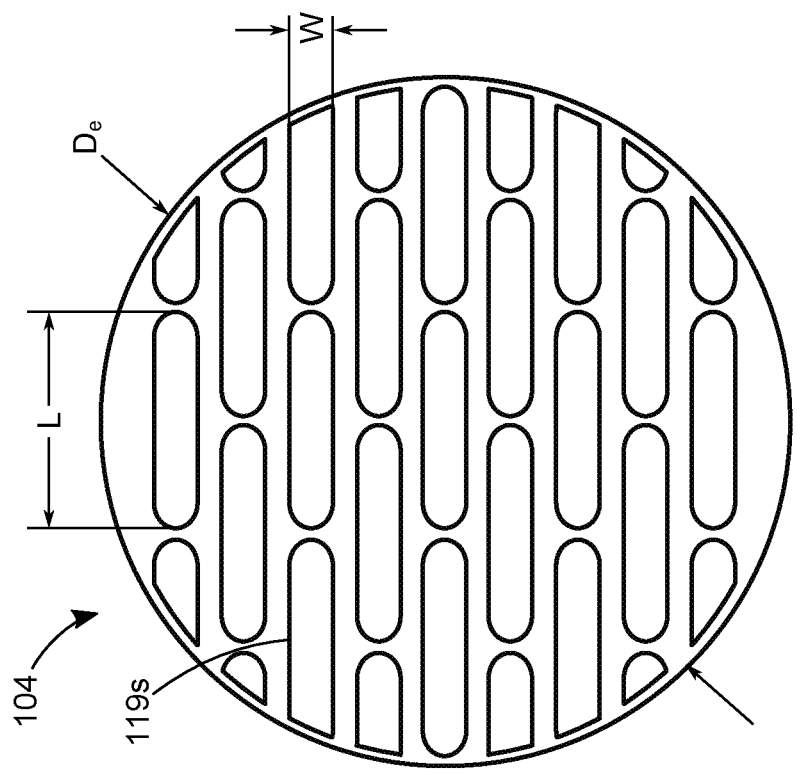
FIG. 4B is a top plan view of bottom electrode according to one or more embodiments of the disclosure.
Figure 4A:
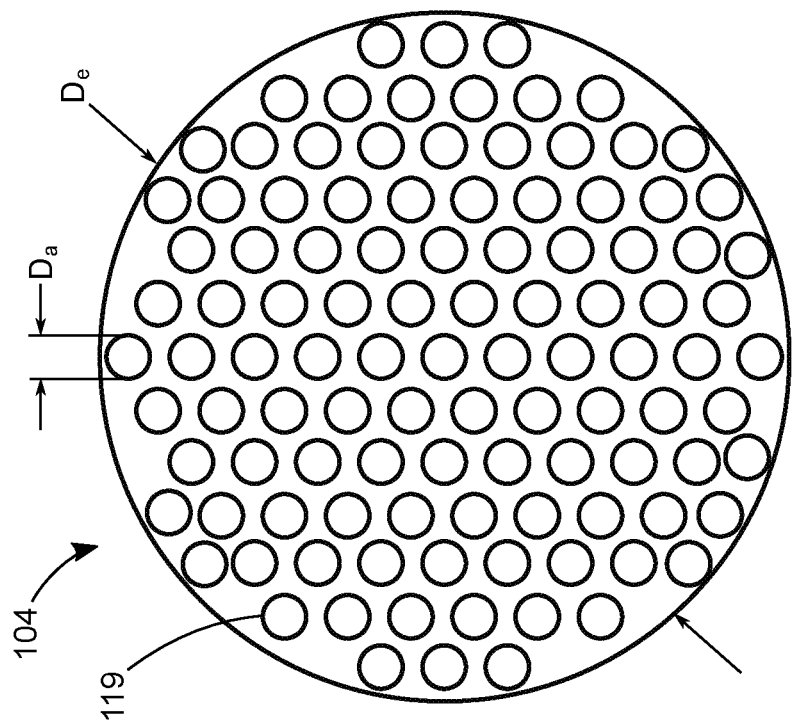
FIG. 4A is a top plan view of bottom electrode according to one or more embodiments of the disclosure.

Referring now to FIG. 4A and FIG. 4B, which show alternative embodiments of a second electrode 104. According to one or more embodiments, the second electrode 104 (or lower plate) comprises a ceramic material. As used herein according to one or more embodiments, "ceramic material" refers to an inorganic, nonmetallic material. Non-limiting examples of ceramic materials include silicon carbide, siliconized silicon carbide, silicon boride, siliconized silicon boride, silicon nitride, siliconized silicon nitride, aluminum oxide (alumina), zirconium oxide (zirconia), and metal matrix composite ceramics, for example Al/SiC, Al/SiB, Al/SiN, etc. In some embodiments, the second electrode comprises a refractory metal such as silicon, molybdenum, rhenium or tungsten.

In one or more embodiments, the lower plate comprises a reaction bonded ceramic material. As used herein according to one or more embodiments, a "reaction bonded ceramic material" refers to a ceramic material in which a first element is infused into a second element. For example, as described further herein, reaction bonded silicon carbide comprises silicon infused into carbon.

As used herein according to one or more embodiments, "reaction bonding" refers to a process in which a porous ceramic preform becomes dense through an in situ chemical reaction of two or more elements. Reaction-bonded silicon nitride is made from finely divided silicon powders that are formed to the shape of a lower plate and subsequently reacted in a mixed nitrogen/hydrogen or nitrogen/helium atmosphere at a high temperature, for example, 1,200° C. to 1,250° C. The nitrogen permeates the porous body and reacts with the silicon to form silicon nitride within the pores. The piece is then heated to a second high temperature, for example 1,400° C., which is just below the melting point of silicon. The nitrogen flow rate and the heating rate are closely controlled, and the entire reaction-bonding process can last up to two weeks. Even though up to 60 percent weight gain occurs during nitriding, there is a less than 0.1 percent dimensional change during nitriding. Reaction bonding is a sometimes referred to as a "net shape" process, which allows for excellent dimensional control and reduces the amount of costly machining and finishing needed after firing. In one or more embodiment, reaction bonding does not utilize sintering aids, and therefore, the high-temperature strength and creep resistance of reaction bonded silicon nitride parts acceptable for plasma source lower plate applications.

According to some embodiments, reaction-bonded silicon carbide is produced from a finely divided, intimate mixture of silicon carbide and carbon. Pieces formed from this mixture are exposed to liquid or vapor silicon at high temperature. The silicon reacts with the carbon to form additional silicon carbide, which bonds the original particles together. Silicon also fills any residual open pores. Reaction bonded silicon carbide undergoes little dimensional change during sintering. Reaction bonded parts exhibit virtually constant strength as temperatures rise to the melting point of silicon.

Reaction bonded silicon carbide manufacturing processes may include infiltration, which involves filling in pores by reaction with or deposition from a liquid or vapor. In the case of liquid reaction, the technique is called melt infiltration, and in the case of vapor phases, it is called chemical vapor infiltration.

In some embodiments, reaction bonded silicon carbide is referred to as siliconized silicon carbide, and may be referred to as a silicon infiltrated ceramic. The infiltration gives the material a unique combination of mechanical, thermal, and electrical properties which can be tuned to the requirements of a plasma source lower plate.

Thus, according to some embodiments, a feature of the reaction bonding process and a reaction bonded ceramic is that the pore space in the starting material is filled by infiltration. Thus, nominally no volume change occurs during processing. This is very different when compared to the sintering and hot pressing processes where the pore space is closed by shrinkage of the part-typically 20% linear shrinkage. Another feature of reaction bonded ceramics is the fact that molten Si, like water, expands upon solidification. Therefore, a finished reaction bonded ceramic is fully dense.

According to one or more embodiments, the ceramic material, the metal matrix composite or the reaction bonded ceramic is then machined to include a plurality of apertures to form the lower plate. Thus, in some embodiments, a plate is formed in a desired shape, for example in the shape of a disc to provide a second electrode 104 (or lower plate) having a diameter $D_e$ and a thickness T. After the plate is formed, for example by reaction bonding a ceramic material such as SiC or any of the other material disclosed herein, apertures 119 are machined in the disc as shown in FIGS. 4A and 4B. In FIG. 4A the apertures 119 are shown as being substantially round or circular and each aperture has a diameter $D_a$. In FIG. 4B, the apertures 119s in the form of elongate slots having a length L and a width W.

According to one or more embodiments, in embodiments in which the apertures 117 in the first electrode 102 and the apertures 119 in the second electrode 104 are round, the apertures 117 in the first electrode and the apertures in the second electrode 104 have a diameter less than 2 mm, less than 1 mm or less than 0.5 mm, and the apertures 117 permit gas to pass through the first electrode 102 to the gap 132. In addition, the diameter $D_a$ of the apertures 119 in FIG. 4A or the length L and width W of the apertures 119s in the second electrode 104 in FIG. 4B provide a percentage of open area comprising the sum of the area of the apertures 119 in the second electrode 104 divided by the area of the second electrode 104 top surface and so that only charged ions pass through the apertures 119 or 119s in the second electrode 104.

In some embodiments, that percentage of open area of all of the apertures 119 in the second electrode 104 is equal to the sum of the open area of all of the apertures 119 or 119s divided by the area of the top surface of the second electrode 104. For round or circular apertures 119 as shown in FIG. 4A, the approximate percentage of open areas of the apertures 119 is limited to no greater than 67% of the second electrode 104. The apertures 119s in the form elongate slots shown in FIG. 4B provide a percentage of open area of the second electrode 104 greater than 67%, greater than 68%, greater than 69% or greater than 70% of the area of the top surface of the second electrode 104. It will be appreciated that the area of the top surface of the second electrode 104 for a circular electrode is equal to $\pi r^2$, where r is ½ of the diameter $D_e$ of the second electrode 104. According to one or more embodiments, the apertures 119s in FIG. 4B are in the form of elongate slots having a width W of 1 mm and a length in the range of from 2 to 3 times the width W, for example 2W, 2.1W, 2.2W, 2.3W, 2.4W, 2.5W, 2.6W, 2.7W, 2.8W, 2.9W, or 3W. In some embodiments, the thickness of the second electrode 104 is in the range of from 1 mm to 2 mm.

According to one or more embodiments, a higher density of apertures 119 or 119s to maximize the percentage of open area is achieved by ultrasonic machining of the apertures 119 or 119s. Ultrasonic machining is a process that removes material from the surface of a part by utilizing high frequency, low amplitude vibrations of a tool against the material surface in the presence of fine abrasive particles. An ultrasonic machining tool travels vertically or orthogonal to the surface of the part at amplitudes of 0.05 to 0.125. The fine abrasive particles are mixed with water to form a slurry that is distributed across the part and the tip of the tool. It was determined that traditional mechanical processes to form apertures 119 that are round as shown in FIG. 4A or apertures 119s that are elongate slots as shown in FIG. 4B that are difficult to form in silicon without causing the second electrode 104 to become brittle due to microcracking. Ultrasonic machining has been found to provide apertures in ceramic electrodes such as the second electrodes 104 shown an FIGS. 4A and 4B made from ceramic materials, in particular, reaction bonded ceramic materials such as reaction bonded silicon carbide. In other embodiments, apertures 119 that are round as shown in FIG. 4A or apertures 119s that are elongate slots as shown in FIG. 4B are formed by laser drilling or laser cutting such as freeform laser cutting. Laser drilling and laser cutting has been found to provide apertures in ceramic electrodes such as the second electrodes 104 shown an FIGS. 4A and 4B made from ceramic materials, in particular, reaction bonded ceramic materials such as reaction bonded silicon carbide.

In one or more embodiments, the apertures in the second electrode are ultrasonic machined apertures, for example ultrasonic machined apertures which are round or elongate slots. In embodiments in which the apertures are round ultrasonic machined apertures, the apertures in the electrode have an open area up to 67% of the area of top surface of the electrode. In embodiments in which the apertures are elongate slot ultrasonic machined apertures, the apertures in the electrode have an open area greater than 67%, greater than 68%, greater than 69% or greater than 70% of the area of the top surface of the electrode.

In one or more embodiments the apertures in the second electrode are laser formed apertures, for example laser drilled apertures or laser cut apertures which are round or elongate slots. In embodiments in which the apertures are round laser formed apertures such as laser cut or laser drilled apertures, the apertures in the electrode have an open area up to 67% of the area of the top surface of the electrode. In embodiments in which the apertures are elongate slot laser formed apertures such as laser cut or laser drilled apertures, the apertures in the electrode have an open area greater than 67%, greater than 68%, greater than 69% or greater than 70% of the area of the top surface of the electrode.

According to one or more embodiments, the second electrode material selection to be one of the material described herein, for example a ceramic material, a reaction bonded ceramic material such as reaction bonded silicon carbide, enables electrodes to be manufactured that have the requisite electrical properties while minimizing metal contamination issues associated with traditional metal electrodes. The use of ultrasonic machining or laser machining as described herein mitigates cost and manufacturing limitations intrinsic to other manufacturing methods, thus enabling a wider range of aperture geometries having a higher percentage of open area of the top surface of the electrode, such as greater than 67%, greater than 68%, greater than 69% and greater than 70% of the area of the top surface of the electrode. In addition the ceramic material, in particular reaction bonded ceramic materials such as reaction bonded silicon carbide provides the ability to form the higher density of apertures and percentage of open area of the top surface of the electrode while maintaining the strength and durability of the electrode without failing during plasma processing conditions.

Figure 5:
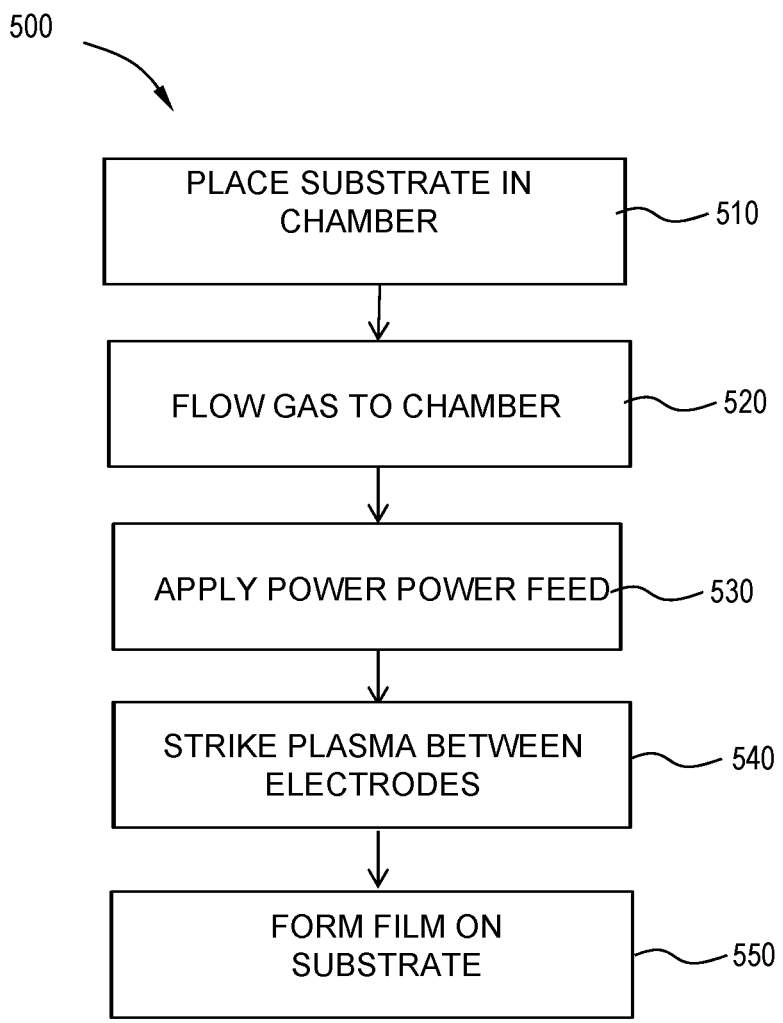
FIG. 5 shows a flow chart of a method in accordance with one or more embodiments of the disclosure.

Referring now to FIG. 5, another aspect pertains to a method 500 of processing a substrate in a substrate processing chamber. The method comprises at 510 placing a substrate in the substrate processing chamber. The substrate processing chamber can be similar to the chamber shown and described herein and in some embodiments comprises a first electrode comprising a conductive plate having a top surface, a bottom surface, an outer peripheral edge and a plurality of apertures allowing a gas to flow therethrough; a second electrode comprising a conductive plate made from a ceramic material and having a top surface, a bottom surface, an outer peripheral edge a plurality of apertures allowing a gas to flow therethrough; a dielectric spacer separating the first electrode and the second electrode and disposed at the outer peripheral edge of the first electrode and the outer peripheral edge of the second electrode; and a power feed electrically connected to the first electrode. The method 500 may further comprise at 510 flowing gas to the chamber and at 530 applying power to a power feed. At 540, the method includes forming or striking a plasma between the first electrode and the second electrode.

In one or more method embodiments, the ceramic material comprises a reaction-bonded ceramic material. In one or more method embodiments, the reaction bonded ceramic material comprises reaction bonded silicon carbide. In one or more method embodiments, the plurality of apertures comprises elongate slots having a width and a length greater than the width.

In one or more method embodiments, the length of the slots is in a range of 2 to 3 times the width. In one or more method embodiments, the second electrode top surface has an area and the plurality of slots define an open area of greater than 68% of the area of the second electrode top surface.

In one or more method embodiments, the apertures are laser formed apertures. In one or more method embodiments, the apertures are laser drilled apertures. In one or more method embodiments, the apertures are ultrasonic machined apertures.

According to one or more embodiments, the substrate is subjected to processing prior to and/or after forming the layer. This processing can be performed in the same chamber or in one or more separate processing chambers. In some embodiments, the substrate is moved from the first chamber to a separate, second chamber for further processing. The substrate can be moved directly from the first chamber to the separate processing chamber, or it can be moved from the first chamber to one or more transfer chambers, and then moved to the desired separate processing chamber. Accordingly, the processing apparatus may comprise multiple chambers in communication with a transfer station. An apparatus of this sort may be referred to as a "cluster tool" or "clustered system", and the like.

Generally, a cluster tool is a modular system comprising multiple chambers which perform various functions including substrate center-finding and orientation, degassing, annealing, deposition and/or etching. According to one or more embodiments, a cluster tool includes at least a first chamber and a central transfer chamber. The central transfer chamber may house a robot that can shuttle substrates between and among processing chambers and load lock chambers. The transfer chamber is typically maintained at a vacuum condition and provides an intermediate stage for shuttling substrates from one chamber to another and/or to a load lock chamber positioned at a front end of the cluster tool. Two well-known cluster tools which may be adapted for the present disclosure are the Centura® and the Endura®, both available from Applied Materials, Inc., of Santa Clara, Calif. However, the exact arrangement and combination of chambers may be altered for purposes of performing specific steps of a process as described herein. Other processing chambers which may be used include, but are not limited to, cyclical layer deposition (CLD), atomic layer deposition (ALD), chemical vapor deposition (CVD), physical vapor deposition (PVD), etch, pre-clean, chemical clean, thermal treatment such as RTP, plasma nitridation, degas, orientation, hydroxylation and other substrate processes. Any of the deposition processes, e.g., CLD, ALD, CVD can be performed in a substrate processing chamber including a plasma source assembly as described herein. In such cases, these processes may be referred to as plasma enhanced CLD, ALD, or CVD. By carrying out processes in a chamber on a cluster tool, surface contamination of the substrate with atmospheric impurities can be avoided without oxidation prior to depositing a subsequent film.

According to one or more embodiments, the substrate is continuously under vacuum or "load lock" conditions, and is not exposed to ambient air when being moved from one chamber to the next. The transfer chambers are thus under vacuum and are "pumped down" under vacuum pressure. Inert gases may be present in the processing chambers or the transfer chambers. In some embodiments, an inert gas is used as a purge gas to remove some or all of the reactants after forming the layer on the surface of the substrate. According to one or more embodiments, a purge gas is injected at the exit of the deposition chamber to prevent reactants from moving from the deposition chamber to the transfer chamber and/or additional processing chamber. Thus, the flow of inert gas forms a curtain at the exit of the chamber.

During processing, the substrate can be heated or cooled. Such heating or cooling can be accomplished by any suitable means including, but not limited to, changing the temperature of the substrate support (e.g., susceptor) and flowing heated or cooled gases to the substrate surface. In some embodiments, the substrate support includes a heater/cooler which can be controlled to change the substrate temperature conductively. In one or more embodiments, the gases (either reactive gases or inert gases) being employed are heated or cooled to locally change the substrate temperature. In some embodiments, a heater/cooler is positioned within the chamber adjacent the substrate surface to convectively change the substrate temperature.

The substrate can also be stationary or rotated during processing. A rotating substrate can be rotated continuously or in discrete steps. For example, a substrate may be rotated throughout the entire process, or the substrate can be rotated by a small amount between exposures to different reactive or purge gases. Rotating the substrate during processing (either continuously or in steps) may help produce a more uniform deposition or etch by minimizing the effect of, for example, local variability in gas flow geometries.

While the foregoing is directed to embodiments of the present disclosure, other and further embodiments of the disclosure may be devised without departing from the basic scope thereof, and the scope thereof is determined by the claims that follow.

What is claimed is:

1. A plasma source assembly comprising:
   a first electrode comprising a conductive plate having a top surface, a bottom surface, and an outer peripheral edge;
   a second electrode comprising a conductive plate having a top surface, a bottom surface, and an outer peripheral edge;
   a dielectric spacer separating the first electrode and the second electrode and disposed at the outer peripheral edge of the first electrode and the outer peripheral edge of the second electrode, the second electrode made from a reaction-bonded ceramic material and comprising a plurality of apertures therein; and
   a power feed electrically connected to the first electrode.

2. The plasma source assembly of claim 1, wherein the reaction bonded ceramic material comprises an element infiltrated into a starting material.

3. The plasma source assembly of claim 2, wherein the reaction bonded ceramic material comprises a reaction bonded silicon carbide.

4. The plasma source assembly of claim 2, wherein the plurality of apertures comprises elongate slots having a width and a length greater than the width.

5. The plasma source assembly of claim 4, wherein the length is in a range of 2 to 3 times the width.

6. The plasma source assembly of claim 5, wherein the second electrode top surface has an area and the plurality of elongate slots define an open area of greater than 68% of the area of the second electrode top surface.

7. The plasma source assembly of claim 4, wherein the apertures are laser formed apertures.

8. The plasma source assembly of claim 7, wherein apertures are laser drilled apertures.

9. The plasma source assembly of claim 4, wherein apertures are ultrasonic machined apertures.

10. The plasma source assembly of claim 1, wherein the first electrode and the second electrode are spaced apart to provide a gap between the first electrode and the second electrode.

11. A plasma source assembly comprising:
    a first electrode comprising a conductive plate having a top surface, a bottom surface, and an outer peripheral edge;
    a second electrode comprising a conductive plate having a top surface, a bottom surface, and an outer peripheral edge;
    a dielectric spacer separating the first electrode and the second electrode and disposed at the outer peripheral edge of the first electrode and the outer peripheral edge of the second electrode, the second electrode made from a reaction bonded silicon carbide and a plurality of apertures therein, and wherein the plurality of apertures comprises elongate slots having a width and a length in a range of from 2 to 3 times greater than the width; and
    a power feed electrically connected to the first electrode.

12. A method of processing a substrate in a substrate processing chamber, the method comprising:
    placing a substrate in the substrate processing chamber comprising a first electrode comprising a conductive plate having a top surface, a bottom surface, an outer peripheral edge and a plurality of apertures allowing a gas to flow therethrough;

a second electrode comprising a conductive plate made from a ceramic material having a top surface, a bottom surface, an outer peripheral edge a plurality of apertures allowing a gas to flow therethrough;

a dielectric spacer separating the first electrode and the second electrode and disposed at the outer peripheral edge of the first electrode and the outer peripheral edge of the second electrode; and a power feed electrically connected to the first electrode; and forming a plasma between the first electrode and the second electrode.

13. The method of claim 12, wherein the ceramic material comprises a reaction-bonded ceramic material.

14. The method of claim 13, wherein the reaction-bonded ceramic material comprises a reaction bonded silicon carbide.

15. The method of claim 13, wherein the plurality of apertures comprises elongate slots having a width and a length greater than the width.

16. The method of claim 15, wherein the length is in a range of 2 to 3 times the width.

17. The method of claim 16, wherein the second electrode top surface has an area and the plurality of elongate slots define an open area of greater than 68% of the area of the second electrode top surface.

18. The method of claim 15, wherein the apertures are laser formed apertures.

19. The method of claim 18, wherein the apertures are laser drilled apertures.

20. The method of claim 15, wherein apertures are ultrasonic machined apertures.

* * * * *